(12) United States Patent
Oberndorfer et al.

(10) Patent No.: US 10,212,809 B2
(45) Date of Patent: Feb. 19, 2019

(54) FLEXIBLE PRINTED CIRCUIT BOARDS AND RELATED METHODS (71) Applicant: Intel Corporation, Santa Clara, CA (US)

(72) Inventors: Fabian Oberndorfer, Krailing (DE); Klaus Doth, Krailing (DE); Raffael Lustig, Germering (DE); Jan Nicolaas Zelhorst, Stockdorf (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/782,269

(22) Filed: Oct. 12, 2017

(65) Prior Publication Data
US 2018/0103543 A1 Apr. 12, 2018

Related U.S. Application Data (60) Provisional application No. 62/407,424, filed on Oct. 12, 2016.

(51) Int. Cl.
H05K 1/02 (2006.01)
H05K 5/00 (2006.01)
(Continued)

(52) U.S. Cl.
CPC ......... *H05K 1/0278* (2013.01); *B64C 39/024* (2013.01); *H02K 11/0094* (2013.01); *H02K 11/33* (2016.01); *H05K 1/0271* (2013.01); *H05K 3/0044* (2013.01); *H05K 3/285* (2013.01); *H05K 3/303* (2013.01); *H05K 5/0017* (2013.01); *H05K 5/0039* (2013.01); *B64C 25/00* (2013.01);
(Continued)

(58) Field of Classification Search
CPC .. H05K 1/0271; H05K 1/0278; H05K 5/0039; B64C 39/024
See application file for complete search history.

(56) References Cited

U.S. PATENT DOCUMENTS

| 6,373,715 B1 | 4/2002 | Zeng et al. | |
| 2003/0067720 A1* | 4/2003 | Hernandez | G11B 5/486 360/245.9 |

(Continued)

OTHER PUBLICATIONS

Tangent Adhesives & More, "Printed Circuit Board (PCB) and Flex Circuit (FPC) Assembly," available at http://tangentindinc.com/applications/printed-circuit-board-pcb-and-flex-circuit-fpc-assembly.html (last accessed Jun. 12, 2018), 2 pages.

(Continued)

*Primary Examiner* — Hoa C Nguyen
(74) *Attorney, Agent, or Firm* — Hanley, Flight and Zimmerman, LLC (57) ABSTRACT Flexible printed circuit boards and related methods are disclosed herein. An example printed circuit board includes a controller interface coupled to a surface of the printed circuit board between a first end of the printed circuit board and a second end of the printed circuit board. The example printed circuit board includes a connector coupled to the surface proximate to the first end. The example printed circuit board includes a notch formed between the controller interface and the connector. The notch is to form a narrowed portion of the printed circuit board to enable the printed circuit board to bend at the narrowed portion.

18 Claims, 5 Drawing Sheets (51) Int. Cl.
*H05K 3/00* (2006.01)
*H05K 3/28* (2006.01)
*H05K 3/30* (2006.01)
*H02K 11/00* (2016.01)
*B64C 39/02* (2006.01)
*H02K 11/33* (2016.01)
*B64D 47/08* (2006.01)
*B64C 25/00* (2006.01)

(52) U.S. Cl.
CPC ........ *B64C 2201/108* (2013.01); *B64D 47/08* (2013.01); *H05K 2201/09063* (2013.01); *H05K 2201/09263* (2013.01); *H05K 2201/1009* (2013.01); *H05K 2201/10189* (2013.01); *H05K 2201/10318* (2013.01); *H05K 2203/0228* (2013.01)

(56) References Cited

U.S. PATENT DOCUMENTS

| | | | | |
|---|---|---|---|---|
| 2006/0148116 | A1* | 7/2006 | Richard | H05K 1/0278 438/48 |
| 2010/0277666 | A1* | 11/2010 | Bertram | F21K 9/00 349/61 |
| 2015/0108862 | A1* | 4/2015 | Chen | H02K 5/225 310/91 |
| 2016/0264234 | A1* | 9/2016 | Vaughn | A63H 27/12 |
| 2016/0351089 | A1* | 12/2016 | Salem | G09F 21/12 |
| 2017/0050749 | A1* | 2/2017 | Pilskalns | B64F 1/362 |
| 2017/0076616 | A1* | 3/2017 | Kanade | G08G 5/045 |
| 2017/0101178 | A1* | 4/2017 | Lee | B64C 39/024 |
| 2018/0044000 | A1* | 2/2018 | Venturelli | B64C 25/405 |
| 2018/0072431 | A1* | 3/2018 | Sahu | B64D 33/08 |

OTHER PUBLICATIONS

San Francisco Circuits, "Flex PCB—(FPCB)," available at https://www.sfcircuits.com/pcb-production-capabilities/flex-pcbs (last accessed Jun. 12, 2018), 4 pages.
Flexible Circuit Technologies, "Flex Printed Circuits," available at https://www.flexiblecircuit.com/product-category/flex-printed/ (last accessed Jun. 12, 2018), 7 pages.
LPKF Laser & Electronics, "Flexible and Rigid-Flexible PCBs," available at http://www.lpkf.com/applications/rapid-pcb-prototyping/circuit-boards/rigid-flexible-printed-circuit-boards.htm (last accessed Jun. 12, 2018), 1 page.
Multi-CB Printed Circuit Boards, "Flexible Circuit Boards," available at https://www.multi-circuit-boards.eu/en/products/printed-circuit-boards/flexible-pcb.html (last accessed Jun. 12, 2018), 3 pages.
TE Connectivity, "Wire-to-Board Connector Types," available at http://www.te.com/usa-en/products/connectors/pcb-connectors/wire-to-board-connectors.html (last accessed Jun. 12, 2018), 3 pages.
AT&S, "Rigid-Flexible PCBs," available at http://ats.net/products-technology/product-portfolio/flexible-rigid-flexible-pcbs/rigid-flexible-pcbs/ (last accessed Jun. 12, 2018), 2 pages.
Multi-CB Printed Circuit Boards, "Rigid-Flex PCBs," available at https://www.multi-circuit-boards.eu/en/products/printed-circuit-boards/rigid-flex-pcb.html (last accessed Jun. 12, 2018), 3 pages.
Multi-CB Printed Circuit Boards, "Flex and Rigid-Flex Boards," available at https://www.multi-circuit-boards.eu/en/pcb-design-aid/leiterplattentypen/flex-rigid-flex.html (last accessed Jun. 12, 2018), 8 pages.
Rigiflex Technology Inc. Blog, "Understanding the 4 Major PCB Laminate Types," available at http://www.rigiflex.com/blog/understanding-the-4-major-pcb-laminate-types/ (last accessed Jun. 12, 2018), 3 pages.
Tan, "The Difference Between Rigid-Flex PCB and Flex PCB with FR4 Stiffener," available at https://www.linkedin.com/pulse/rigid-flex-pcb-vs-rigidized-flex-construction-della-tan/ (last accessed Jun. 12, 2018), 5 pages.
Corrigan, "What's the Difference Between PCB and FPC?", available at https://www.linkedin.com/pulse/whats-difference-between-pcb-fpc-john-corrigan/ (last accessed Jun. 12, 2018), 4 pages.
"PCB Material Selection Guide," available at https://www.pcbcart.com/pcb-capability/pcb-materials.html (last accessed Jun. 12, 2018), 12 pages.

* cited by examiner

FLEXIBLE PRINTED CIRCUIT BOARDS AND RELATED METHODS

RELATED APPLICATION

This patent claims the benefit of U.S. Provisional Patent Application Ser. No. 62/407,424, filed on Oct. 12, 2016, under 35 U.S.C. § 119(e). U.S. Provisional Patent Application Ser. No. 62/407,424 is hereby incorporated herein by reference in its entirety.

FIELD OF THE DISCLOSURE

This disclosure relates generally to printed circuit boards, and, more particularly, to flexible printed circuit boards and related methods.

BACKGROUND

Printed circuit boards (PCBs) can vary in shape and/or size based on different form factors of system platforms that carry the PCBs. In some examples, a PCB is disposed in a housing that encloses or substantially encloses the PCB. One or more system components (e.g., a motor) may be operatively coupled to the PCB. However, plugging, soldering, or otherwise directly mounting the component to the PCB may be difficult due to the enclosure of the PCB by the housing. Accordingly, cables are typically used to couple the system component to the PCB Unmanned aerial vehicles (e.g., drones) include one or more rotors that provide lift to enable the unmanned aerial vehicle (UAV) to fly. An example rotor includes a motor to control rotation of the blades of the rotor. The UAV includes one or more controllers (e.g., a processor) to control operation of the motor of the rotor. The controller(s) may be coupled to one or more PCBs carried by the UAV.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

A printed circuit board (PCB) provides mechanical support to one or more components coupled to the PCB, such as resistors, antennas, controllers (e.g., processors), etc. The PCB electrically couples two or more components coupled to the PCB via traces, connecting pads, and/or other features formed on a surface of the PCB. In some examples, the PCB electrically couples one or more components external to the PCB, such as a motor, to one or more components on the PCB to enable communication between the external component(s) and the PCB component(s) via the traces, connecting pads, and/or other features of the PCB.

For example, in the context of an unmanned aerial vehicle (UAV), a PCB may include a controller (e.g., a processor) to operatively control one or more components of the UAV, such as rotor(s), landing gear, camera(s), etc. The PCB may be disposed in a housing of the UAV to, for example, protect the PCB from the environment. However, the enclosure of the PCB by the housing makes it difficult to couple the other component(s) (e.g., a motor of a rotor) of the UAV to the PCB by plugging or soldering the component(s) to the surface of the PCB. Instead, in known examples, cables or wires are used as intermediaries between the connecting pads on the PCB and the component(s) that are to be coupled to the PCB, but are spaced apart from the PCB.

As an example, a PCB of a UAV can include a controller to control a motor of rotor of the UAV. The PCB may be disposed in a housing of the UAV that also supports the motor. However, the motor may be spaced apart from the PCB relative to the housing. For example, a length of the PCB may not extend to the location at which the motor is coupled to the housing. In known examples, one or more wires may be soldered to the PCB. The wire(s) are threaded through the housing to the motor and soldered to, for example, a pinout of the motor to couple the motor to the PCB to enable the controller on the PCB to communicate with the motor. However, the use of wire(s) in a UAV can increase a weight of the UAV, as the wire(s) typically are made of a metal, such as copper, covered with insulating materials. Further, manipulating the wire(s) through the housing and soldering the respective ends of the wire(s) to the motor and the PCB can increase a time required to assemble the UAV. Also, a length of the wire(s) may be selected to provide for wire slack to facilitate ease of assembly when threading the wires through the housing and soldering the wires to the PCB and the motor. Wire slack may also be provided to reduce tension on the wire(s) when the wire(s) are coupled to the PCB and motor. However, the excess length of the wire(s) increases the weight of UAV and, thus, reduces efficient operation of the UAV during flight.

In some examples, to avoid or reduce the use of wires, a PCB having a length such that the PCB extends in the housing to the location at which the motor is coupled to housing may be used. Such a PCB may provide for a direct coupling of the motor to the PCB via, for example, an electrical pin connection. However, known PCBs may not sufficiently withstand mechanical stresses as the length of the PCBs increases. Further, to prevent adding weight to the UAV, a thickness of the PCB should be minimized. However, a long, thin PCB may not be able to withstand stresses to which the PCB board is subject during assembly and/or operation, including mechanical stresses from the component(s) coupled to the board and thermal stresses from heat generated during operation of the board. Further, when a component such as a motor of a rotor is coupled to the PCB, the PCB may experience stress in multiple directions due to twisting forces associated with torque generated during operation of the motor. As a result, some known PCBs may crack or facture during use. Therefore, UAVs may include one PCB per rotor, which can increase a weight of the UAV due the duplication of components on each PCB and increase the number of components in the UAV that require assembly and/or maintenance.

Some known PCBs include a substantially rigid portion and a substantially flexible portion to reduce stresses on the PCBs. However, such known rigid-flex PCBs may use different materials for the rigid portion(s) and the flexible portion(s). Also, manufacturing of rigid-flex PCBs may involve different manufacturing processes for the rigid portion(s) and the flexible portion(s). For example, the rigid portion(s) may include different numbers and/or types of PCB substrate and/or laminate layers than the flexible portion(s). Thus, known rigid-flex PCBs are associated with increased costs and manufacturing times as compared to non-flexible PCBs.

Disclosed herein are example PCBs that provide for direct coupling of one or more system components to the PCBs while reducing mechanical stresses on the PCBs. In examples disclosed herein, a PCB includes one more notches, grooves, or cutouts formed on a surface of the PCB between a first portion of the PCB and a second portion of the PCB. The notches enable the PCB to flex or bend (e.g., within a particular range of movement) at the notched portion. Thus, when a component such as a motor of a rotor is coupled to the first portion of the PCB and exerts forces on the PCB, the notched portion of the PCB reduces the mechanical stresses transferred from the first portion of the PCB to the second portion of the PCB due to the flexibility imparted to the PCB by the notches.

The flexible portions of the example PCBs disclosed herein enables a length of the PCBs to be increased and/or thickness of the PCBs to be reduced with a substantially reduced risk (or without a risk) of the PCBs cracking or fracturing as compared to PCBs that do not include the flexible portions. In examples disclosed herein, flexible, elongated PCBs can be used with a UAV to couple, for instance, motor(s) of two or more rotors to a single PCB via electrical pin connections with a substantially reduced risk that the PCB crack, facture, or otherwise not withstand the forces exerted thereon by the rotors. Further, the increased length of example PCBs disclosed herein facilitates ease of assembly with other components when the PCBs are disposed in a housing of, for example, a UAV. For example, an example PCB disclosed herein can be aligned relative to the housing with respect to the one or more other components (e.g., motor(s) of rotor(s)) that are supported by the housing and are to be coupled to the PCB. As a result, the component(s) can be directly coupled to the PCB, which substantially eliminates the need for wire connections and reduces assembly time as compared to examples in which wires are soldered to the PCB and manipulated via the housing to reach the component(s).

Also disclosed herein are example methods for manufacturing PCBs to include notches or cutouts that impart flexibility to the PCB. Example methods disclosed herein including forming traces in a metal layer of the PCB and cutting notches in the PCB around the traces to remove material from the PCB. The selective removal of the PCB material via the notches results in a PCB including one or more substantially narrowed portions as compared to the remainder of the PCB. The narrowed portion(s) of the PCB enable the PCB to flex or bend at the narrow portion(s). Thus, example methods for manufacturing disclosed herein provide for flexible PCBs without requiring, for instance, different materials to be coupled together to form flexible and rigid portions. Therefore, example methods disclosed herein can be implemented to efficiently manufacture flexible PCBs at reduced costs as compared to known rigid-flex PCBs.

Although examples disclosed herein are primarily discussed in the context of PCBs for use with unmanned aerial vehicles, the teachings disclosed herein can be utilized in other applications in which one or more components spaced apart from a PCB are to be communicatively coupled to the PCB, which may or may not be disposed in a housing. As such, the discussion of unmanned aerial vehicles is for illustrative purposes only and does not limit this disclosure of PCBs to use with unmanned aerial vehicles.

Figure 1:
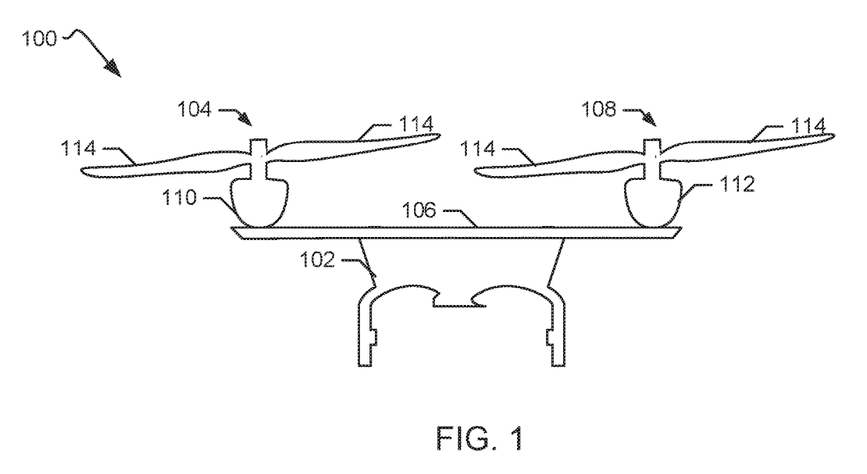
FIG. 1 illustrates an example unmanned aerial vehicle in which the examples disclosed herein can be implemented.

FIG. 1 illustrates an example unmanned aerial vehicle (UAV) 100 in which the examples disclosed herein can be implemented. The example UAV 100 includes a body 102. The body 102 may carry one or more controller(s), power source(s), sensor(s), etc. for the UAV 100. The example UAV 100 includes a first rotor 104 coupled to the body 102 via a rotor support 106 and a second rotor 108 coupled to the body 102 via the rotor support 106. In some examples, the rotor support 106 is a tube. The first rotor 104 includes a motor 110 and the second rotor 108 includes a motor 112. Each rotor 104, 108 includes blades 114 operatively coupled to the respective motors 110, 112. The example UAV 100 can include additional or fewer rotors. Also, the rotors 104, 108 can include additional or fewer blades than shown in FIG. 1.

In the example of FIG. 1, the rotor support 106 can include one or more materials such as aluminum, carbon fiber, plastic, or other materials that may be substantially lightweight but rigid and, thus, capable of supporting the rotor(s) 104, 108. The rotor support 106 can be a rod, a tube, an I-beam, or a structure having another shape than illustrated in FIG. 1. In the example of FIG. 1, an interior of the rotor support 106 is substantially hollow. As discussed below, the rotor support 106 houses a printed circuit board including a controller to control the first motor 110 and the second motor 112 to operate the respective rotors 104, 108.

Figure 2:
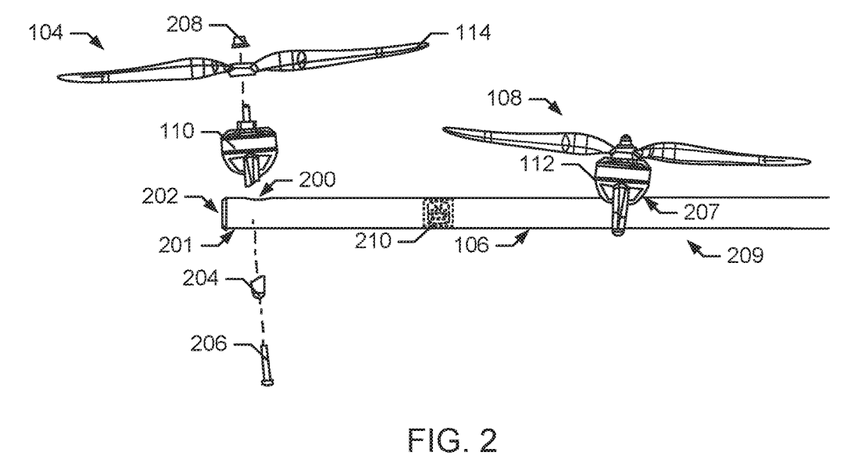
FIG. 2 is a partial view of the example unmanned aerial vehicle of FIG. 1 including example rotors and an example rotor support, one of the rotors shown in an assembly view relative to the rotor support.

FIG. 2 is a partial view of the example UAV of FIG. 1 including the first rotor 104, the second rotor 108, and the rotor support 106. For illustrative purposes, the first rotor 104 is shown as uncoupled from the rotor support 106 in an assembly view.

As shown in FIG. 2, the rotor support 106 includes a first opening 200 defined in a surface of the rotor support 106. The first opening 200 enables at least a portion of the motor 110 of the first rotor 104 to be received in an interior 202 of the rotor support 106. The first opening 200 can be formed proximate to a first end 201 of the rotor support 106 or at other positions along the rotor support 106. In the example of FIG. 2, the motor 110 is coupled to the rotor support 106 via one or more fixtures 204 and/or one or more screw(s) 206 that secure the motor 110 relative to the rotor support 106. In some examples, the rotor support 106 includes an opening formed in the rotor support 106 opposite a side on which the first opening 200 is formed to receive the fixture(s) 204 and/or the screw(s) 206. Also, the blade(s) 114 of the first rotor 104 are coupled to the motor 110 via one or more caps 208. The rotors 104, 108 can be coupled to the rotor support 106 at different positions relative to the rotor support 106 than illustrated in FIG. 2.

The second rotor 108 can be coupled to the rotor support 106 substantially as discussed above with the first rotor 104. For example, the rotor support includes a second opening 207 defined in a surface of the rotor support 106. The second opening 207 enables at least a portion of the motor 112 of the second rotor 108 to be received in the interior 202 of the rotor support 106. The second opening 207 can be formed proximate to a second end 209 of the rotor support 106. The second rotor 108 can be removably secured to the rotor support 106 via one or more fixtures 204, screws 206, etc.

The example rotor support 106 can includes additional or fewer openings to receive additional or fewer rotors. Also, the positions of the opening(s) 200, 207 relative to the rotor support 106 can differ from that shown in FIG. 2. In some examples, position(s) of the opening(s) 200, 207 relative to the rotor support 106 are based on, for example, a number of rotors to be coupled to the rotor support 106, a weight of the rotor(s), etc. to provide stability when the rotor(s) are coupled to the rotor support 106.

In the example of FIG. 2, the first rotor 104 and the second rotor 108 are operatively controlled via a controller 210 disposed in the interior 202 of the rotor support 106. The controller 210 can be implemented by one or more programmable processor(s), logic circuit(s), application specific integrated circuit(s) (ASIC(s)), etc. The controller 210 executes machine readable instructions (e.g., a software program) to control the rotor(s) 104, 108. For example, the controller 210 can control a speed at which the blade(s) 114 of the rotor(s) 104, 108 rotate to generate lift for the UAV 100 and to enable the UAV 100 to move in one or more directions (e.g., along a pitch axis, a roll axis, and/or a yaw axis). The controller 210 can execute the instructions based on one or more user inputs or autonomously based on, for example, one or more predefined algorithms. In the example of FIG. 2, the controller 210 is coupled to a printed circuit board disposed in the interior 202 of the rotor support 106 to enable communication between the controller 210 and the motor(s) 110, 112 of the rotor(s) 104, 108.

Figure 3:
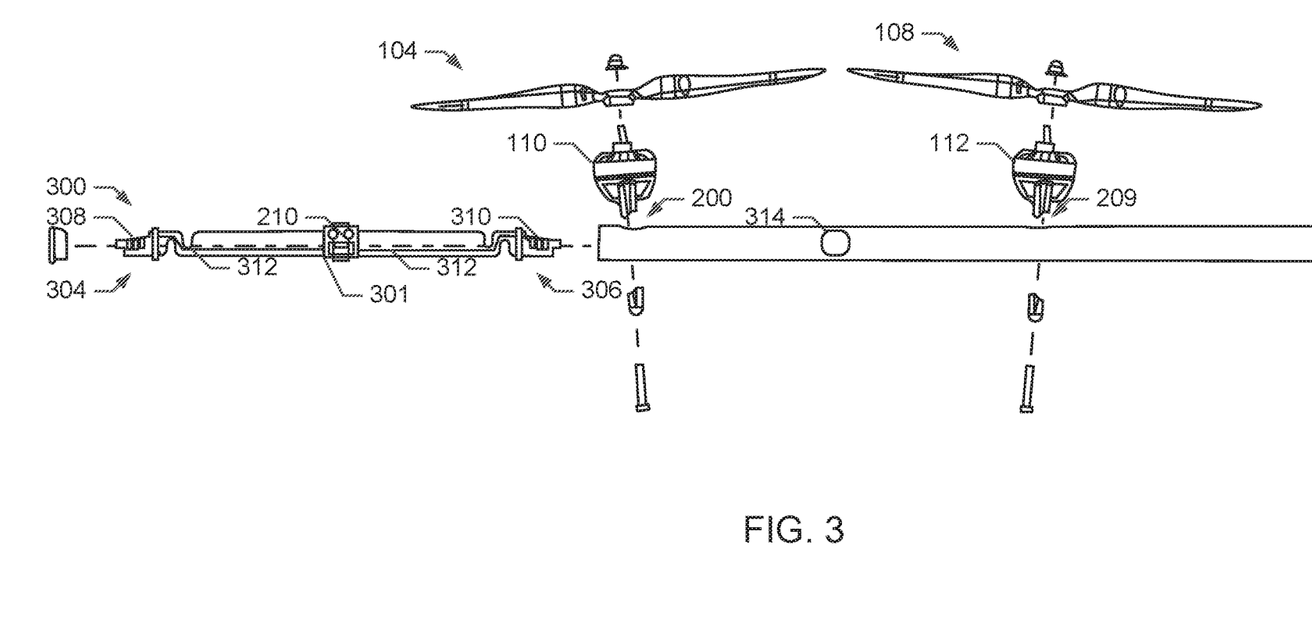
FIG. 3 is an assembly view of the example rotors of FIG. 2, the example rotor support of FIG. 2, and an example printed circuit board that may be disposed in the example rotor support to operatively control the rotor(s).

FIG. 3 is an assembly view of the example rotors 104, 108, the example rotor support 106, and an example printed circuit board (PCB) 300 to which the example controller 210 of FIG. 2 is coupled to control the rotors 104, 108. In operation, the example PCB 300 of FIG. 3 is disposed in the interior 202 of the rotor support 106 such that the motors 110, 112 can be directly coupled to connectors of the PCB 300 without the use of wires.

The example PCB 300 of FIG. 3 includes one or more layers coupled to (e.g., adhered to) one another. For example, the PCB 300 can include a fiberglass substrate, a metal layer such as a copper foil laminated to the substrate (e.g., via heat and/or an adhesive), and a solder mask disposed on the metal layer. The example PCB 300 of FIG. 3 can have other shapes and/or sizes than illustrated in FIG. 3.

In the example of FIG. 3, the controller 210 is coupled to the PCB 300 via a controller interface 301 coupled to the PCB 300 (e.g., a surface of the PCB such the solder mask of the PCB 300). The controller interface 301 can include, for example, a CPU socket, solder bumps, a ball grid array, or one or more other types of board connectors. Although in FIG. 3 the controller 210 is shown as coupled to the PCB 300 via the controller interface 301 at substantially a midpoint of the PCB 300, the controller 210 can be coupled to the PCB 300 at a different position than illustrated in FIG. 3. For example, the controller 210 can be coupled to the PCB 300 proximate to a first end 304 of the PCB 300 or a second end 306 of the PCB 300.

The example PCB 300 of FIG. 3 includes a first electrical pin connector 308 disposed proximate to the first end 304 of the PCB 300 and a second electrical pin connector 310 disposed proximate to the second end 306 of the PCB. When the example PCB 300 of FIG. 3 is disposed in the interior 202 of the rotor, the first electrical pin connector 308 is aligned or substantially aligned with the first opening 200 of the rotor support 106 such that the motor 110 of the first rotor 104 can be coupled to the first electrical pin connector 308 (e.g., via one or more electrical pins of the motor 110). Also, the second electrical pin connector 310 is aligned or substantially aligned with the second opening 207 of the rotor support 106 such that the motor 112 of the second rotor 108 can be coupled to the second electrical pin connector 310.

The example PCB 300 includes one or more traces 312 (e.g., formed via the metal layer of the PCB) to electrically couple the controller 210 to the respective motor 110, 112 of the rotors 104, 108. The trace(s) 312 can extend from the controller interface 301 to the electrical pin connector(s) 308, 310. As discussed above, the controller 210 can control, for example, an amount of power provided to motor(s) 110, 112, a speed at which the rotor(s) 104, 108 are to operate, etc. In some examples, the rotor support 106 includes a controller housing 314 (e.g., a slot or an opening defined in an interior-facing surface of the rotor support 106) to receive the controller 210 when the PCB 300 is disposed in the interior 202 of the rotor support 106. The controller housing 314 can hold the controller 210 substantially in place when the PCB 300 is disposed in the rotor support 106 to reduce, for example, movement of the controller 210 due to vibrations from the motor(s) 110, 112 of the rotor(s) 104, 108.

Figure 4:
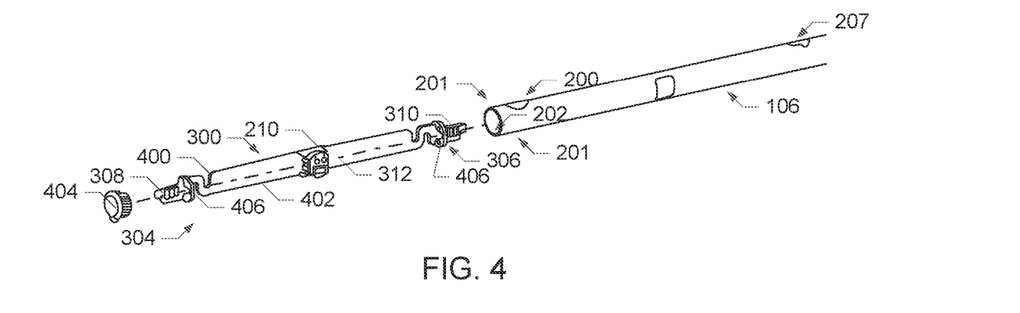
FIG. 4 is a perspective view of the example rotor support of FIG. 2 and the example printed circuit board of FIG. 3, the printed circuit board removed from the rotor support.

FIG. 4 is a perspective view of the example PCB 300 and the example rotor support 106. For illustrative purposes, the PCB 300 is shown as removed from the interior 202 of the rotor support 106 in FIG. 4. As shown in FIG. 4, the example PCB 300 includes a first layer 400, or a non-conductive substrate layer (e.g., a fiberglass material). The example PCB 300 includes a second layer 402 coupled to the first layer 400, or a conductive layer. The second layer includes a metal layer or laminate in which the trace(s) 312 are formed. The example PCB 300 can include additional layers than shown in FIG. 4 (e.g., a solder mark, a silk screen, additional layers of substrate and/or metal).

As illustrated in FIG. 4, the positions of the electrical pin connectors 308, 310 at the respective first and second ends 304, 306 of the example PCB 300 facilities alignment of the electrical pin connectors 308, 310 with the openings 200, 207 of the rotor support 106 when the PCB 300 is disposed in the interior 202 of the rotor support 106. The positions of the electrical pin connector(s) 308, 310 relative to the PCB 300 can differ from that shown in FIG. 4 based on, for example, a position of the openings 200, 207 of the rotor support 106, a number of rotors to be coupled to the PCB 300, etc.

In some examples, the PCB 300 is removably secured in the interior 202 of the rotor support 106 via a cap 404 that can be coupled to the end 201 of the rotor support 106 to substantially enclose the PCB 300 in the rotor support 106. In some examples, a second cap is coupled to the rotor support 106 proximate to the end 209 of the rotor support 106. As also illustrated in FIG. 4, in some examples, the PCB 300 includes one or more collars 406 disposed about the PCB 300 proximate to the end(s) 304, 306 of the PCB 300. The collar(s) 406 help secure the PCB 300 in the interior 202 of the rotor support 106 by, for instance, reducing sliding or vibration of the PCB 300 during operation of the motor(s) 110, 112 of the rotor(s) 104, 108.

Thus, in the examples of FIGS. 3 and 4, the motor(s) 110, 112 of the rotor(s) 104, 108 can be coupled to the PCB 300 via a plug connection with the corresponding electrical pin connectors 308, 310 of the PCB 300. The example PCB of FIGS. 3 and 4 provides for direct couplings between the rotors 104, 108 and the PCB 300 and, thus, eliminates the need for wires to electrically couple the motor(s) 110, 112 to the controller 210. The reduction or elimination of wires helps to reduce a weight of the UAV 100 and, thus, provide for more efficient operation of the UAV 100.

When the example rotors 104, 108 of FIGS. 1-3 are coupled to the example PCB 300 of FIGS. 3 and 4, forces generated by the motor(s) 110, 112 of the rotor(s) 104, 108 during operation of the motor(s) 110, 112 may be transferred to one or more portions of the PCB 300. For example, rotational forces due to torque generated by the motor(s) 110, 112 may be transferred to the portions of the PCB 300 proximate to the electrical pin connector(s) 308, 310 where the motor(s) 110, 112 are coupled to the PCB 300. As another example, the PCB 300 may experience forces in the y-direction when the rotor(s) 104, 108 cause the UAV 100 to rise or descend and the motor(s) 110, 112 push or pull on the PCB 300 at the electrical pin connector(s) 308, 310. Thus, the direct connection of the motor(s) 110, 112 to the PCB 300 can cause the PCB 300 to experiences mechanical stresses. In some examples, excessive stress on the PCB 300 can cause the PCB 300 to fracture or crack over time.

Figure 5:
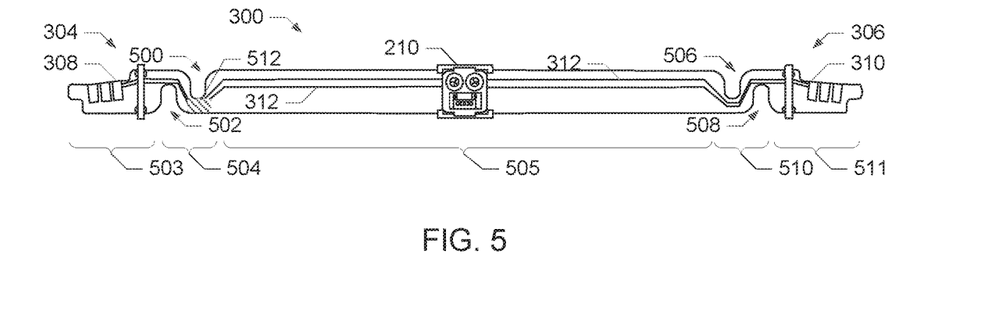
FIG. 5 is a front view of the example printed circuit board of FIG. 3.

FIG. 5 is a front view of the example PCB 300 of FIGS. 3 and 4. As illustrated in FIG. 5, the PCB 300 includes a first notch 500 and a second notch 502 cut into layers of the PCB 300 (e.g., the first and second layers 400, 402) proximate to the first end 304 of the PCB 300. As shown in FIG. 5, one or more portions of the PCB 300 are removed from the PCB 300 to form the notches 500, 502. As a result, the first notch 500 and the second notch 502 form a first narrowed portion 504 of the PCB 300. The first narrowed portion 504 has a width that is less than a width of a first remaining portion 503 of the PCB 300, or a portion of the PCB including the first electrical pin connector 308, and a second remaining portion 505, or a portion of the PCB 300 including the controller 210. As discussed below, the notches 500, 502 can be formed in the PCB 300 via a milling cutter.

As also illustrated in FIG. 5, the PCB 300 includes a third notch 506 and a fourth notch 508 cut into the PCB 300 proximate to the second end 306 of the PCB 300. The third notch 506 and the fourth notch 508 form a second narrowed portion 510 of the PCB 300 as a result of the removal of material of the PCB 300 to form the notches 506, 508. The second narrowed portion 504 has a width that is less than a width of the second remaining portion 505 of the PCB 300 (i.e., the portion of the PCB including the controller 210) and a third remaining portion 511 of the PCB 300, or a portion of the PCB 300 including the second electrical pin connector 310.

In some examples, the first narrowed portion 504 and/or the second narrowed portion 510 are substantially S-shaped. The shape of the narrowed portion(s) 504, 510 can differ from the examples of FIG. 5. Also, a size and/or shape of the respective notches 500, 502, 506, 508 can differ from the example notches shown in FIG. 5. In some examples, the size and/or shape of the respective notches 500, 502, 506, 508 are based on a width and/or a thickness of the PCB 300 (e.g., the width and/or thickness of the conductive and non-conductive layers 400, 402). The example PCB 300 can include additional or fewer notches than shown in the FIG. 5.

As illustrated in FIG. 5, the traces 312 of the PCB 300 remain intact when the material of the PCB 300 is removed to form the notches 500, 502, 506, 508. For example, the traces 312 can include non-linear portions such that the traces 312 follow respective paths around the portions of the PCB 300 that are to be removed to form the notches 500, 502, 506, 508.

In the example of FIG. 5, the first and second narrowed portions 504, 510 of the PCB 300 allow the PCB 300 to flex or bend in the x-, y-, and/or z-directions at the respective ends 304, 306 of the PCB 300. The degree to which the narrowed portions 504, 510 can flex or bend can be based on material characteristics of the layers of the PCB 300. Thus, the narrowed portions 504, 510 impart flexibility or give movement to the PCB 300 as compared to if the PCB 300 did not include the notches 500, 502, 506, 508 and was substantially rigid along a length of the PCB 300. As illustrated in FIG. 5, the first narrowed portion 504 separates the portion of the PCB 300 including the first electrical pin connector 308 (i.e., the first remaining portion 503 of FIG. 5) from the portion of the PCB 300 including the controller 210 (i.e., the second remaining portion 505 of FIG. 5). Put another way, the first narrowed portion intervenes between the first electrical pin connector 308 and the controller 210. When the motor 110 of the first rotor 104 is coupled to the first electrical pin connector 308, the first narrowed portion 504 of the PCB 300 reduces or removes stresses experienced by the PCB 300 during operation of the motor 300 by flexing in response to forces (e.g., vibrational forces, twisting forces) transferred from the motor 110 to PCB 300. Thus, the first narrowed portion 504 constrains the stresses on the PCB 300 to the portion of the PCB 300 where the motor 110 is coupled to the first electrical pin connector 308 (i.e., the first remaining portion 503 of FIG. 5). Instead of stresses generated at the coupling of the motor 110 to the electrical pin connector being transferred throughout a rigid PCB 300, the first narrowed portion 504 flexes in the x-, y-, and/or z-direction to prevent the remainder to the PCB 300 (e.g., the second remaining portion 505 including the controller 210) from experiencing the stresses. As a result, the stresses experienced by the PCB 300 proximate to, for example, the controller 210, are substantially reduced as compared to if the PCB 300 did not include the first narrowed portion 504. Thus, the first narrowed portion 504 is a stress-relieving portion of the PCB 300.

The example second narrowed portion 510 can also flex or bend as substantially as discussed above in connection with the first narrowed portion 504 in response to stresses generated at the coupling of the motor 112 of the second rotor 108 to the second electrical pin connector 310. Thus, the second narrowed portion is a stress-relieving portion of the PCB 300. By changing a shape of the PCB 300 via the notches 500, 502, 506, 508 to form the stress-relieving or narrowed portions 504, 510 in the PCB 300, mechanical stresses experienced by the PCB 300 are substantially reduced or removed as a result of the ability of the PCB 300 to flex or bend at the narrowed portions 504, 510. Therefore, instances of cracking or fracturing of the PCB 300 during operation of the motor(s) 110, 112 are substantially reduced due to the formation of the notches 500, 502, 506, 508.

Constraining the stresses on the PCB 300 to the locations at which the motors 110, 112 couple to the PCB 300 via the stress-relieving or narrowed portions 504, 510 reduces the mechanical stresses experienced by the PCB 300 during operation of the motors 110, 112. As a result of the reduction of stresses on the PCB 300, a length of the PCB 300 can be increased without a risk (or with a substantially reduced risk) that the PCB 300 will fracture or crack, as compared to if the PCB 300 did not include the notches 500, 502, 506, 508. Unlike a long, rigid PCB that is not flexible, the example PCB 300 is subjected to less stress along a length of the PCB 300 due the flexibility of the narrowed portions 504, 510 and constraint of the stresses experienced by the PCB 300 to the motor coupling locations (e.g., at the ends 304, 306 of the example PCB 300 of FIG. 3). Therefore, the length of the PCB 300 can be selected so as to enable the electrical pin connectors 308, 310 to align with the openings 200, 207 of the rotor support 106. In the example UAV 100 of FIG. 1, the controller 210 of the PCB 300 can control the motor 110 of the first rotor 104 and the motor 112 of the second rotor 108 via direct coupling of the motors 110, 112 to the PCB 300 due to the elongated length of the PCB 300 as compared to PCBs that are not flexible. Thus, the example PCB 300 of FIGS. 3-5 provides for direct coupling of the motors 110, 112 to the PCB 300 with reduced mechanical stress on the PCB, enables the controller 210 to be used to control both motor 110, 112, and, therefore, reduces a number of PCBs and controllers carried by the UAV 100.

In some examples, the narrowed portions 504, 510 of the PCB 300 include one or more reinforcing materials 512 applied as a top coat to the PCB 300 proximate to one or more of the notches 500, 502, 506, 508. The reinforcing material(s) 512 can include a fibrous material such as carbon fiber that is flexible and serves to reinforce the stress-relieving or narrowed portions 504, 510 when the narrowed portions 504, 510 bend or flex due to stress. In some examples, the reinforcing material(s) 512 include a plastic or a rubber. In other examples, the reinforcing material(s) 512 are infused or injected into one or more layers of the PCB 300 prior to assembly of the layers.

Figure 6:
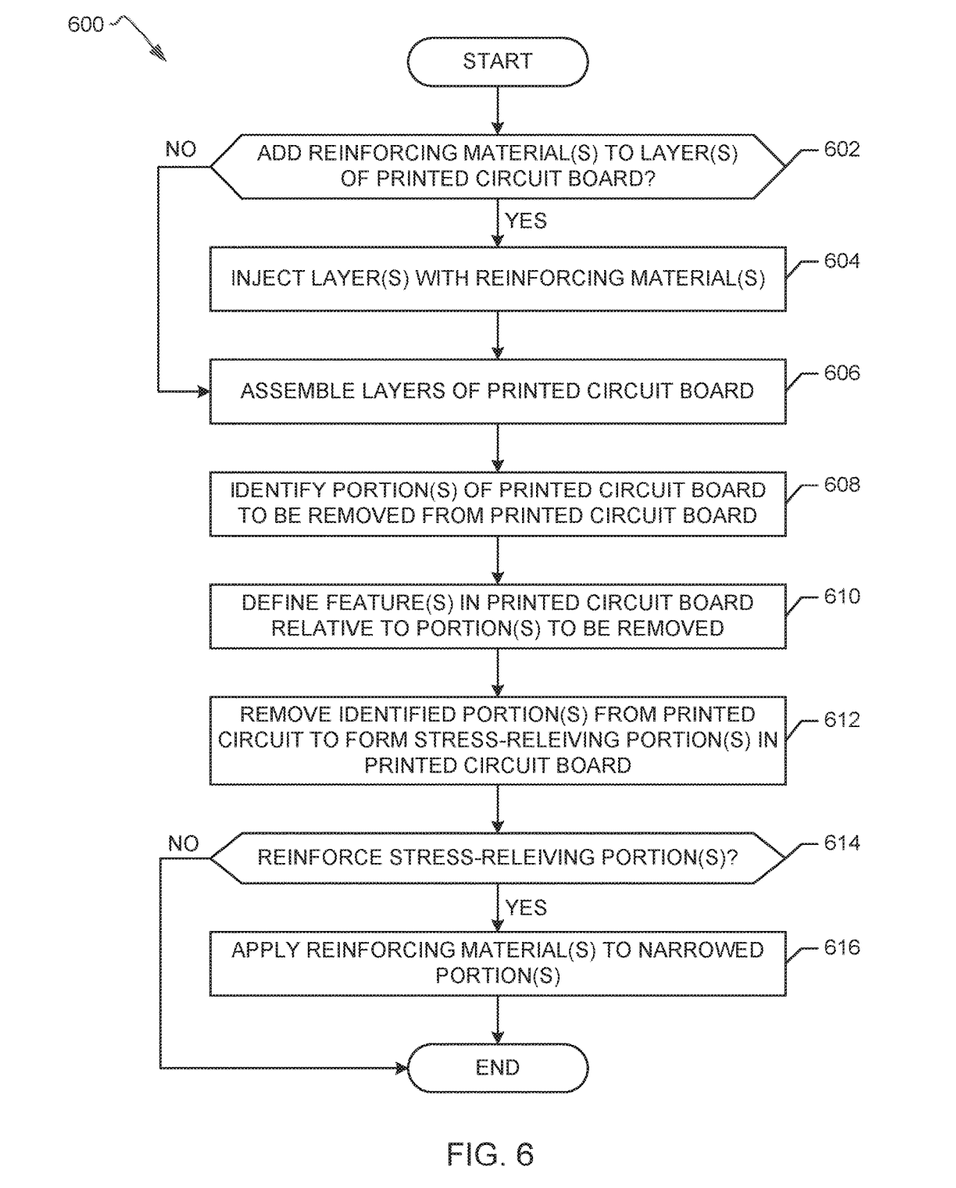
FIG. 6 is a flowchart representative of an example process disclosed herein.

FIG. 6 is a flowchart illustrating an example process 600 for constructing a printed circuit board (e.g., the PCB 300 of FIG. 3-5). The example process 600 may be used to construct a printed circuit board (PCB) including one or more stress-relieving portions (e.g., the narrowed portions 504, 510 of FIG. 5) that bend or flex to substantially reduce mechanical stresses experienced by the PCB. Although the example process 600 is discussed with respect to the flowchart illustrated in FIG. 6, many other methods of constructing the example PCB 300 may alternatively be used. For example, the order of execution of the blocks may be changed, and/or some of the blocks described may be changed, eliminated, or combined.

The example process 600 of FIG. 6 begins with a decision as to whether to add one or more reinforcing materials to one or more layers that are to form a PCB (block 602). In some examples, one or more reinforcing materials, such carbon fiber and/or rubber, may be injected or infused into one or more layers that are to form the PCB to facilitate bending or flexing of the PCB.

If a decision is made to add reinforcing material(s) to the layer(s) of the PCB, the example process 600 includes injecting the layer(s) with the reinforcing material(s) (block 604). For example, the non-conductive or first layer 400 of the example PCB 300 of FIGS. 3-5 can be injected with fibrous material to increase an ability of the PCB to bend while reducing instances of cracking or fracturing.

The example process 600 of FIG. 6 continues with assembling the layers of the printed circuit board (block 606). For example, the metal or second layer 402 of FIG. 4 can be coupled to (e.g., adhered to) the first or non-conductive layer 400 of FIG. 4 to form the PCB 300.

The example process 600 of FIG. 6 includes identifying one or more portions of the PCB to be removed from the PCB (block 608). For example, a portion of the PCB may be identified for removal based on a proximity of the portion to a position at which one or more components are to be coupled (e.g., directly coupled) to the PCB such that the PCB will experience or is likely to experience mechanical stress due to the coupling. For example, a portion of the example PCB 300 of FIG. 3 proximate to a position at which the first electrical pin connector 308 is to be coupled to the PCB 300 (e.g., proximate to the first end 304 of the PCB 300) may be identified for removal, as the PCB 300 is likely to experience stresses due to the coupling of the first motor 110 of the rotor 104 to first electrical pin connector 308. Similarly, a portion of the example PCB 300 of FIG. 3 proximate to a position at which the second electrical pin connector 310 is to be coupled to the PCB 300 (e.g., proximate to the first end 306 of the PCB 300) may be identified for removal, as the PCB 300 is likely to experience stresses due to the coupling of the first motor 112 of the rotor 108 to second electrical pin connector 310.

The example process 600 of FIG. 6 includes defining one or more features in the printed circuit board relative to the portion(s) of the PCB to be removed (block 610). The features can include wire traces formed in one or more metal layers of the PCB that serve to communicatively couple one or more components of the PCB such as a controller to one or more other components (e.g., a motor) coupled to the PCB (e.g., via electrical pins, cables, etc.). The features can be formed in the PCB via, for example, etching using one or more masks or screens. The features (e.g., the traces) can be positioned on the PCB so as to avoid the portion(s) of the PCB that are to be removed. The features can include substantially linear portions and substantially non-linear portions such that the features follow paths around the portion(s) that are to be removed.

For example, the trace(s) 312 of FIGS. 3-5 can be formed in the PCB 300 to communicatively couple the controller 210 to the components coupled to the pin connector(s) 308, 310, such as the motor(s) 110, 112 of the first and second rotors 104, 108. The example traces 312 can be formed by, for example, etching the PCB 300 to selectively remove metal (e.g., copper) from the metal layer 402 of the PCB 300. The example traces 312 include non-linear patterns such that the traces 312 follow paths that do not extend into the portions of the PCB 300 that are to be removed.

The example process 600 of FIG. 6 includes removing the portion(s) identified for removal from the PCB to form stress-relieving portion(s) in the PCB (block 612). The identified portion(s) can be removed via one or more cutting tools, such as a milling cutter. The identified portion(s) can be removed by forming, for example, cuts, notches, slits, apertures, etc. in the PCB to narrow one or more portions of the PCB as compared to the portions of the PCB that are not cut. As a result of the cutting of the PCB, the PCB can flex or bend at the stress-relieving portion(s) when, for example, the PCB is subjected to mechanical stress from one or more components coupled to the PCB. In the example process 600, due to the placement, layout, and/or pattern of the features (e.g., traces) of the PCB relative to the portion(s) that are to be cut, the cuts do not interfere with the features and, thus, remain intact after the cutting of the PCB.

For example, the PCB 300 of FIG. 3 includes the notches 500, 502, 506, 508 corresponding to portions of the PCB 300 that have been removed, for instance, via cutting of the PCB 300. As a result of the removal of PCB material and formation of the notches 500, 502, 506, 508, the example PCB 300 includes the first stress-relieving or narrowed portion 504 and the second stress-relieving or narrowed portion 510. The narrowed portions 504, 510 have reduced or narrowed width as compared to, for example, the first, second, and third remaining portions 503, 505, 511 of the example PCB 300. The narrowed portions 504, 510 can be, for example, substantially S-shaped and can bend or flex in one or more x-, y-, or z-directions within a degree of motion defined by, for example, material characteristics of the layers of the PCB 300. In the examples of FIGS. 3-5, at least a portion of the traces 312 disposed in the narrowed portion(s) 504, 510 and, thus, the traces communicatively couple the controller 210 to the motor(s) 110, 112 via the narrowed portion(s) 504, 510.

The example process 600 of FIG. 6 includes a decision as to whether to reinforce the stress-relieving portion(s) of the PCB with one or more reinforcing materials (block 614). In some examples, one or more reinforcing materials, such carbon fiber, a plastic, and/or a rubber, maybe applied as a top coat to the stress-relieving portion(s) to strengthen the stress-relieving portion(s), increase flexibility, and/or to reduce a risk of cracking during flexing or bending of the stress-relieving portion(s).

If a decision is made to reinforce the narrowed portion(s), the example process 600 includes applying the reinforcing material(s) to the stress-relieving portion(s) (block 616). For example, a reinforcing material 512 such as carbon fiber material may be applied as a top coat to the narrowed portion(s) 504, 510 of the example PCB 300 of FIG. 3.

Thus, the example process 600 of FIG. 6 provides for construction of a PCB that includes one or more flexible, stress-relieving portions via the introduction of notches or cuts into the PCB. The example process 600 of FIG. 6 can be used to generate a flexible PCB without requiring special assembly techniques and/or materials to provide flexibility to the PCB. Rather, the formation of notches or cuts in the PCB to generate the stress-relieving portions of the PCB provides a cost-efficient and effective way of introducing flexibility into the PCB.

Figure 7:
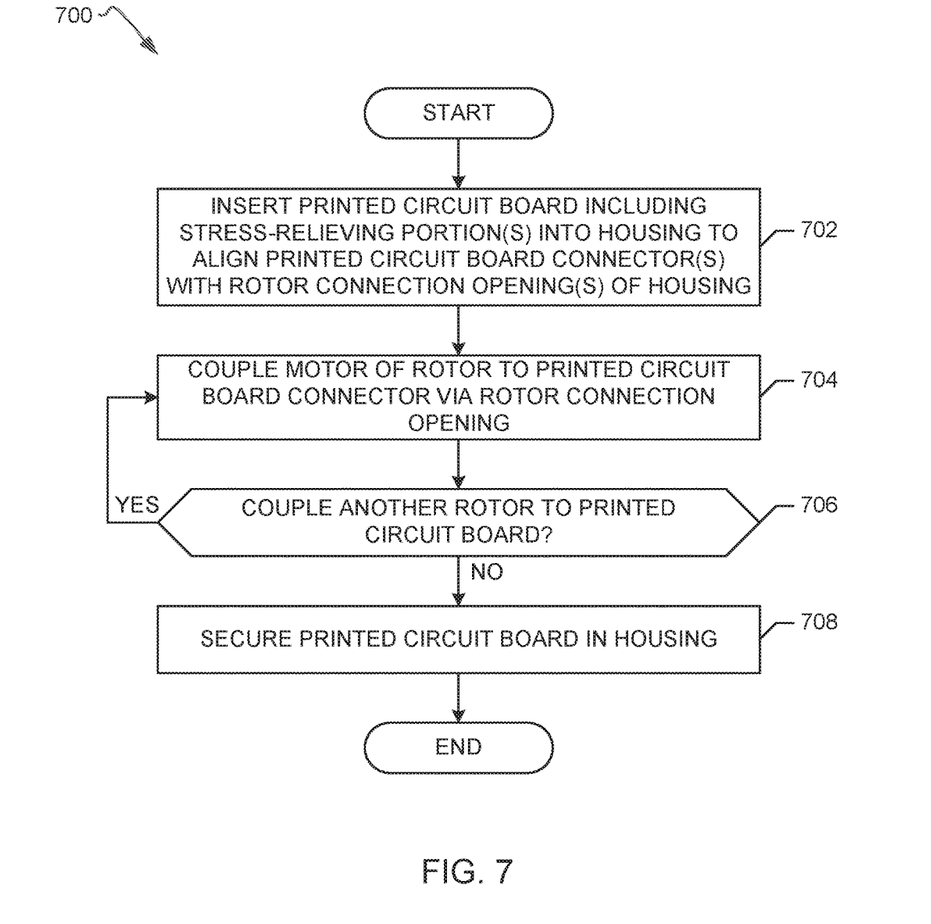
FIG. 7 is a flowchart representative of another example process disclosed herein.

FIG. 7 is a flowchart illustrating an example process 700 for coupling one or more rotors (e.g., the rotor(s) 104, 108 of FIGS. 1-3) of an unmanned aerial vehicle (e.g., the UAV 100 of FIG. 1) to a printed circuit board (e.g., the PCB 300 of FIGS. 3-5). Although the example process 700 is discussed with respect to the flowchart illustrated in FIG. 7, many other methods of coupling rotor(s) to a PCB may alternatively be used. For example, the order of execution of the blocks may be changed, and/or some of the blocks described may be changed, eliminated, or combined. Also, although the example process 700 is discussed in connection with rotors for unmanned aerial vehicles, the example process 700 may be applied to other applications in which one or more components (e.g., motor(s), antenna(s)) are to be coupled to a PCB.

The example process 700 of FIG. 7 includes inserting a PCB including one or more stress-relieving portions into a housing to align one or more connectors of the PCB (e.g., electrical pin connectors) with one or more rotor connection openings of the housing (block 702). For example, the example PCB 300 of FIG. 3 including the stress-relieving or narrowed portions 504, 510 can be inserted into the interior 202 of the example rotor support 106 of the UAV 100 of FIG. 1. The PCB 300 can be inserted into the interior 202 of the rotor support 106 such that the first electrical pin connector 308 of the PCB 300 is aligned with the first opening 200 of the rotor support 106 and the second electrical pin connector 310 of the PCB 300 is aligned with the second opening 207 of the rotor support 106.

The example process 700 of FIG. 7 includes directly coupling a motor of a rotor to one of the printed circuit board connectors via the rotor connection opening of the housing (block 704). For example, the motor 110 of the first rotor 104 of the FIG. 1 can be coupled to the first electrical pin connector 308 of the example PCB 300 of FIG. 3 via the first opening 200 of the rotor support 106.

The example process 700 of FIG. 7 includes a decision as to whether to couple another rotor to the PCB (block 706). As discussed above, two or more rotors can be coupled to the example PCB 300 of FIG. 3 due to the elongated length of the PCB 300 as compared to other PCBs that do not include the stress-relieving or narrowed portions 504, 510.

If another rotor is to be coupled to the printed circuit board, the example process 700 returns to block 704. For example, the motor 112 of the second rotor 108 of FIG. 1 can be coupled to the second electrical pin connector 310 of the PCB 300 via the second opening 207 of the rotor support 106.

When there are no other rotors to be coupled to the PCB, the example process 700 includes securing the PCB in the housing (block 708). For example, the cap 404 can be coupled to the first end 201 of the rotor support 106 substantially enclose the PCB 300 in the rotor support 106. In some examples, one or more collars 406 are disposed about one or more portions of the PCB 300 (e.g., proximate to the narrowed portions 504, 510) to reduce movement of the PCB 300 relative to the rotor support 106 (e.g., due to motor vibrations).

Thus, the example process 700 of FIG. 7 provides for coupling of two or more rotors to a printed circuit board with a substantially reduced risk of the PCB cracking or fracturing due to stresses experienced by the PCB during operation of the rotors. Rather, the ability of the stress-relieving portions of the PCB to flex or bend in response to the stresses substantially reduces or eliminates the transfer of the stresses along the length of the PCB. Therefore, a length of the PCB can be increased as compared to other PCBs that do not include the stress-relieving portions and, thus, may only be able to support one rotor. As a result, a time to assemble, for example, a UAV including the example PCBs disclosed herein may be reduced as compared to examples in which wires are used to couple rotors to PCBs.

From the foregoing, it will be appreciated that example methods, apparatus and articles of manufacture have been disclosed to generate printed circuit boards including one or more stress-relieving portions that substantially reduce and/or eliminate mechanical stresses experienced by the PCB when one or more components (e.g., motor(s)) are coupled to the PCB. In examples disclosed herein, the stress-relieving portion(s) can be formed by cutting notches into the PCB to enable the PCB to flex and substantially constrain or isolate the mechanical stresses experienced by the PCB. In examples disclosed herein, a length of the PCB can be increased without a risk of the PCB cracking or fracturing as compared to rigid PCBs that do not include the stress relieving portions. Further, example methods disclosed herein provide for the creation of PCBs including the flexible or stress-relieving portions without requiring expensive materials and/or time-consuming manufacturing techniques.

The following is a non-exclusive list of examples disclosed herein. Other examples may be included above. In addition, any of the examples disclosed herein can be considered in whole or in part, and/or modified in other ways.

Example 1 includes a printed circuit board including a controller interface coupled to a surface of the printed circuit board between a first end of the printed circuit board and a second end of the printed circuit board and a connector coupled to the surface proximate to the first end. The example the printed circuit board includes a notch intervening between the controller interface and the connector. The notch is to form a narrowed portion of the printed circuit board to enable the printed circuit board to bend at the narrowed portion.

Example 2 includes the printed circuit board as defined in example 1, further including a trace formed the surface of the printed circuit board, at least a portion of the trace to be disposed in the narrowed portion.

Example 3 includes the printed circuit board as defined in example 2, wherein the connector includes an electrical pin connector, the trace to extend from the controller interface to the electrical pin connector via the narrowed portion.

Example 4 includes the printed circuit board as defined in examples 1 or 2, wherein the narrowed portion is a first narrowed portion and the printed circuit board further includes a second narrowed portion, the first narrowed portion disposed proximate to the first end and the second narrowed portion disposed proximate to the second end.

Example 5 includes the printed circuit board as defined in claim 1, wherein the notch is a first notch and further including a second notch formed between the controller interface and the connector, the first notch and the second notch to form the narrowed portion.

Example 6 includes the printed circuit board as defined in examples 1 or 2, wherein a width of the narrowed portion is less than a width of a first portion of the surface including the controller interface and a width of a second portion of the surface including the connector.

Example 7 includes an apparatus including a housing, a printed circuit board disposed in the housing, a controller to be coupled to a first portion of the printed circuit board, and a motor to be coupled to a second portion of the printed circuit. The printed circuit board includes a first notch and second notch to form a third portion of the printed circuit board. The third portion is disposed between the first portion and the second portion. The third portion is to bend in response to stress on the second portion from the motor.

Example 8 includes the apparatus as defined in example 7, wherein a width of the third portion is less than a width of the first portion and the second portion.

Example 9 includes the apparatus as defined in example 7, wherein the housing includes an opening defined therein, the opening to receive at least a portion of the motor.

Example 10 includes the apparatus as defined in example 9, wherein the printed circuit board includes an electrical pin connector, the motor to be coupled to the electrical pin connector via the opening.

Example 11 includes the apparatus as defined in example 7, wherein the printed circuit board is substantially enclosed by the housing when the motor is coupled to the electrical pin connector.

Example 12 includes the apparatus as defined in example 7, wherein the motor is a first motor and further including a second motor to be coupled to a fourth portion of the printed circuit board.

Example 13 includes the apparatus as defined in example 12, wherein the printed circuit board further includes a third notch and a fourth notch to form a fifth portion of the printed circuit board, the fifth portion to bend in response to stress on the fourth portion from the second motor.

Example 14 includes the apparatus as defined in example 13, wherein a width of the fifth portion is less than the first portion, the second portion, and the fourth portion.

Example 15 includes the apparatus as defined in examples 7 or 8, further including a collar coupled to the printed circuit board.

Example 16 includes the apparatus as defined in example 7, wherein the printed circuit board includes a trace, the trace to communicatively couple the controller to the motor via the third portion.

Example 17 includes the apparatus as defined in examples 7 or 9, wherein the motor is to be coupled to a rotor.

Example 18 includes the apparatus as defined in example 7, wherein the housing is to be coupled to an unmanned aerial vehicle.

Example 19 includes a method including forming a trace in a first portion of a layer of a printed circuit board and cutting one or more notches in a second portion of the printed circuit board to narrow a portion of the printed circuit board, at least a portion of the trace to be disposed in the narrowed portion.

Example 20 includes the method as defined in example 19, further including applying a top coat to the narrowed portion.

Example 21 includes the method as defined in example 20, wherein the top coat includes a carbon fiber material.

Example 22 includes the method as defined in example 19, wherein the cutting of the notches in the second portion is based on a position at which a motor is to be coupled to the printed circuit board.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A printed circuit board comprising:
   a controller interface coupled to a surface of the printed circuit board between a first end of the printed circuit board and a second end of the printed circuit board; and
   a connector coupled to the surface proximate to the first end, the printed circuit board including a notch intervening between the controller interface and the connector, the notch to form a narrowed portion of the printed circuit board to enable the printed circuit board to bend at the narrowed portion.

2. The printed circuit board of claim 1, further including a trace formed the surface of the printed circuit board, at least a portion of the trace to be disposed in the narrowed portion.

3. The printed circuit board of claim 2, wherein the connector includes an electrical pin connector, the trace to extend from the controller interface to the electrical pin connector via the narrowed portion.

4. The printed circuit board of claim 1, wherein the narrowed portion is a first narrowed portion and the printed circuit board further includes a second narrowed portion, the first narrowed portion disposed proximate to the first end and the second narrowed portion disposed proximate to the second end.

5. The printed circuit board of claim 1, wherein the notch is a first notch and further including a second notch formed between the controller interface and the connector, the first notch and the second notch to form the narrowed portion.

6. The printed circuit board of claim 1, wherein a width of the narrowed portion is less than a width of a first portion of the surface including the controller interface and a width of a second portion of the surface including the connector.

7. An apparatus comprising:
a housing;
a printed circuit board disposed in the housing;
a controller to be coupled to a first portion of the printed circuit board; and
a motor to be coupled to a second portion of the printed circuit, the printed circuit board including a first notch and second notch to form a third portion of the printed circuit board, the third portion disposed between the first portion and the second portion, the third portion to bend in response to stress on the second portion from the motor.

8. The apparatus of claim 7, wherein a width of the third portion is less than a width of the first portion and the second portion.

9. The apparatus of claim 7, wherein the housing includes an opening defined therein, the opening to receive at least a portion of the motor.

10. The apparatus of claim 9, wherein the printed circuit board includes an electrical pin connector, the motor to be coupled to the electrical pin connector via the opening.

11. The apparatus of claim 7, wherein the printed circuit board is substantially enclosed by the housing when the motor is coupled to the electrical pin connector.

12. The apparatus of claim 7, wherein the motor is a first motor and further including a second motor to be coupled to a fourth portion of the printed circuit board.

13. The apparatus of claim 12, wherein the printed circuit board further includes a third notch and a fourth notch to form a fifth portion of the printed circuit board, the fifth portion to bend in response to stress on the fourth portion from the second motor.

14. The apparatus of claim 13, wherein a width of the fifth portion is less than the first portion, the second portion, and the fourth portion.

15. The apparatus of claim 7, further including a collar coupled to the printed circuit board.

16. The apparatus of claim 7, wherein the printed circuit board includes a trace, the trace to communicatively couple the controller to the motor via the third portion.

17. The apparatus of claim 7, wherein the motor is to be coupled to a rotor.

18. The apparatus of claim 7, wherein the housing is to be coupled to an unmanned aerial vehicle.

* * * * *